(12) United States Patent
Kim

(10) Patent No.: US 7,883,913 B2
(45) Date of Patent: Feb. 8, 2011

(54) MANUFACTURING METHOD OF IMAGE SENSOR OF VERTICAL TYPE

(75) Inventor: Jong Man Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/638,121

(22) Filed: Dec. 15, 2009

(65) Prior Publication Data
US 2010/0159628 A1  Jun. 24, 2010

(30) Foreign Application Priority Data
Dec. 18, 2008  (KR) ...................... 10-2008-0129183

(51) Int. Cl.
*H01L 21/00* (2006.01)

(52) U.S. Cl. .............................. 438/29; 438/42; 438/45; 438/455; 257/E21.11; 257/E21.54; 257/E21.546

(58) Field of Classification Search ................ 438/516; 257/E21.11, E21.147, E21.366, E21.48, E21.527
See application file for complete search history.

(56) References Cited

U.S. PATENT DOCUMENTS 6,841,411 B1 * 1/2005 Varghese ..................... 438/94

2005/0139828 A1 * 6/2005 Maruyama et al. ............ 257/59
2009/0278221 A1 * 11/2009 Tomomatsu ................ 257/458
2010/0006762 A1 * 1/2010 Yoshida et al. .......... 250/361 R

FOREIGN PATENT DOCUMENTS

KR       2006000900 A  * 1/2006

* cited by examiner

*Primary Examiner*—Charles D Garber
*Assistant Examiner*—Cheung Lee
(74) *Attorney, Agent, or Firm*—Saliwanchik, Lloyd & Saliwanchik

(57) ABSTRACT

A manufacturing method of an image sensor of vertical type is provided that includes: forming an insulation layer with a metal wiring and a contact plug therein on a first substrate; bonding a second substrate having an image sensing unit over the insulation layer; forming a trench in the second substrate to divide the image sensing unit for each pixel; forming a PTI by gap-filling the trench with insulating material; forming a first material layer over the PTI, the image sensing unit, and the insulation layer; and forming a second material layer over the first material layer and performing a deuterium annealing process thereon. The crystal defects of the substrate generated when performing the trench etching on the donor substrate to define unit pixels are cured by performing the deuterium annealing process, making it possible to improve the sensitivity and illumination characteristics of the image sensor of vertical type.

9 Claims, 3 Drawing Sheets

MANUFACTURING METHOD OF IMAGE SENSOR OF VERTICAL TYPE

CROSS-REFERENCE TO RELATED APPLICATION

This application claims the benefit under 35 U.S.C. §119 of Korean Patent Application No. 10-2008-0129183, filed Dec. 18, 2008, which is incorporated herein by reference in its entirety.

BACKGROUND

An image sensor is a semiconductor device that converts an optical image into an electrical signal, and is generally classified as a charge coupled device (CCD) image sensor and a complementary metal oxide semiconductor (CMOS) image sensor (CIS).

In the related art, a photodiode is formed on a substrate using an ion implantation method. However, as the size of the photodiode is gradually reduced in order to increase the number of pixels without increasing chip size, the area of a light receiving part is reduced, which tends to reduce image quality.

Moreover, although there exists a method of increasing electron generation rate by increasing capacitance of the photodiode, there is a limitation in expanding a depletion region of the photodiode in order to increase capacitance. In addition, a photo aperture ratio is lowered by a structure formed by a back end process of the photodiode.

As one of alternative proposals for solving the problem as described above, the photodiode is formed with amorphous silicon (Si) or a structure where a readout circuitry is formed on a silicon (Si) substrate (main substrate) and the photodiode is formed on another substrate (donor substrate) and bonded to the upper portion of the readout circuitry through a wafer-to-wafer bonding method is attempted (for reference, referred to as "three-dimensional image sensor" and "PD-up CIS").

The structure as described above is made by forming a p+ region, an n− region, and an n+ region in the photodiode region of the donor substrate in sequence and bonding the donor substrate to the main substrate.

However, when a pixel trench isolation (PTI) process is performed for isolating between the photodiodes forming a pixel unit after the donor substrate is coupled to the main substrate, excessive plasma damage due to the etching is generated, causing a problem that a plurality of dark defects are generated at a chip edge.

This causes the low illumination characteristics of the image sensor to degrade and the production yield to reduce.

BRIEF SUMMARY

An embodiment provides a manufacturing method of an image sensor that has excellent sensitivity and illumination characteristics by minimizing the effects of dark defects generated when performing a trench etching on a donor substrate functioning as a photodiode (light receiving unit) of an image sensor of vertical type in a pixel unit.

A manufacturing method of an image sensor of vertical type according to an embodiment includes: forming an insulation layer that includes a metal wiring and a contact plug on a first substrate that includes a wiring and a readout circuitry; bonding a second substrate that includes an image sensing unit over the insulation layer; forming a trench in the second substrate in order to divide the image sensing unit for each pixel; forming a PTI by gap-filling the trench with insulating material; forming a first material layer over the PTI, the image sensing unit, and the insulation layer; and forming a second material layer over the first material layer and performing a deuterium annealing process thereon to cure crystal defects of the substrate generated while forming the trench.

DETAILED DESCRIPTION

A manufacturing method of an image sensor of vertical type according to embodiments will be described in detail with reference to the accompanying drawings.

Hereinafter, in describing the embodiments, the detailed description of the relevant well-known functions or constituents may make the gist of the present embodiment obscure. Thus, only core constituents related directly to the technical idea of the present invention will be described.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Figure 1:
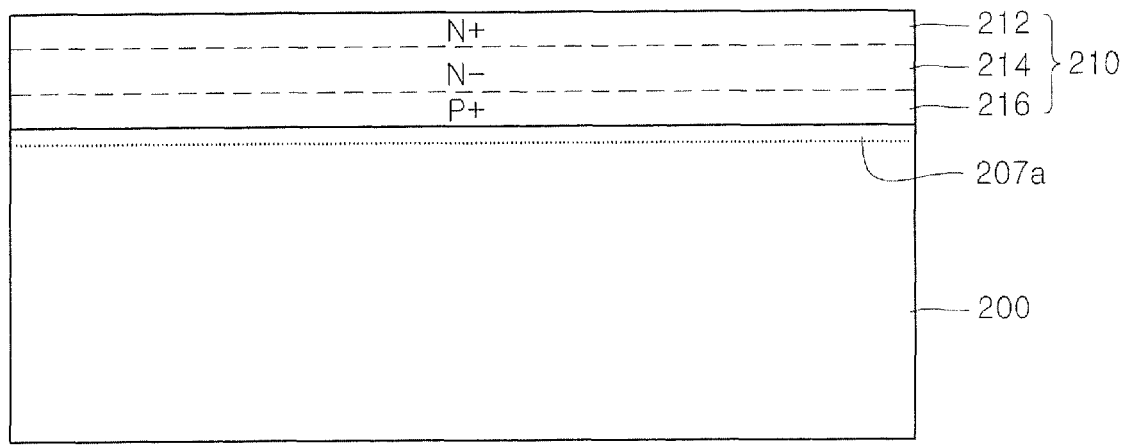
FIG. 1 is a cross-sectional view showing an image sensing unit formed on a second substrate (donor substrate).

FIG. 1 shows an image sensing unit 210 formed on a second substrate 200 (donor substrate).

According to an embodiment, a crystalline semiconductor layer (not shown) is formed on the second substrate 200 (donor substrate) using an epitaxial method. Thereafter, hydrogen ions are implanted into the interface between the second substrate 200 and the crystalline semiconductor layer, thereby forming a hydrogen ion implanting layer 207a. The implantation of the hydrogen ions may be performed after an ion implantation for forming an image sensing unit 210.

Because the image sensing unit 210 is formed over the crystalline semiconductor layer, the image sensing unit 210 adopts a three-dimensional image sensor positioned on the upper side of a readout circuitry to raise a fill factor, making it possible to inhibit defects within the image sensing unit.

The image sensing unit 210 may be a photodiode, but it may also be a photogate or a coupled shape of the photodiode and the photogate. Meanwhile, although the embodiment describes that the image sensing unit 210 is formed on a crystalline semiconductor layer by way of example, it is not limited thereto. For example, the image sensing unit 210 may be formed over an amorphous semiconductor layer.

According to an embodiment, the image sensing unit 210 is formed over the crystalline semiconductor layer by an ion implantation. For example, a second conductivity type conductive layer 216 to be used as a ground part of a light receiving unit is formed at the lower portion of the crystalline semiconductor layer. For example, a high-concentration P type conductive layer 216 can be formed at the lower portion of the crystalline semiconductor layer by ion-implanting over the second substrate 200 with a blanket process without using a mask.

Thereafter, a first conductivity type conductive layer 214 to be used as part of a light receiving unit is formed over the second conductivity type conductive layer 216. For example, a low-concentration N type conductive layer 214 can be formed over the second conductivity type conductive layer 216 by ion-implanting over the second substrate 200 with a blanket process without using a mask.

Thereafter, a further embodiment may include forming a high-concentration first conductivity type conductive layer 212 over the first conductivity type conductive layer 214. For example, a high-concentration N+ type conductive layer 212 is further formed over the first conductivity type conductive layer 214 by ion-implanting over the second substrate 200 using a blanket method without a mask, thereby making it possible to contribute to an ohmic contact.

Meanwhile, a first substrate (100 in FIG. 2) on which a wiring and a readout circuitry are formed is prepared. For example, an active region is defined by forming a device isolation layer in a first substrate, and the readout circuitry including transistors is formed over the active region. For example, the readout circuitry may be formed by including a transfer transistor Tx, a reset transistor Rx, a drive transistor Dx, and a select transistor Sx.

In a further embodiment, a first conductivity type connection region is formed on the first substrate in order to make a smooth moving path of photo charges between the image sensing unit 210 and the readout circuit.

Next, an insulation layer (110 in FIG. 2) that includes a metal wiring (112 in FIG. 2), a contact plug (114 in FIG. 2), and a metal contact (116 in FIG. 2) formed therein is formed on the first substrate.

Figure 2:
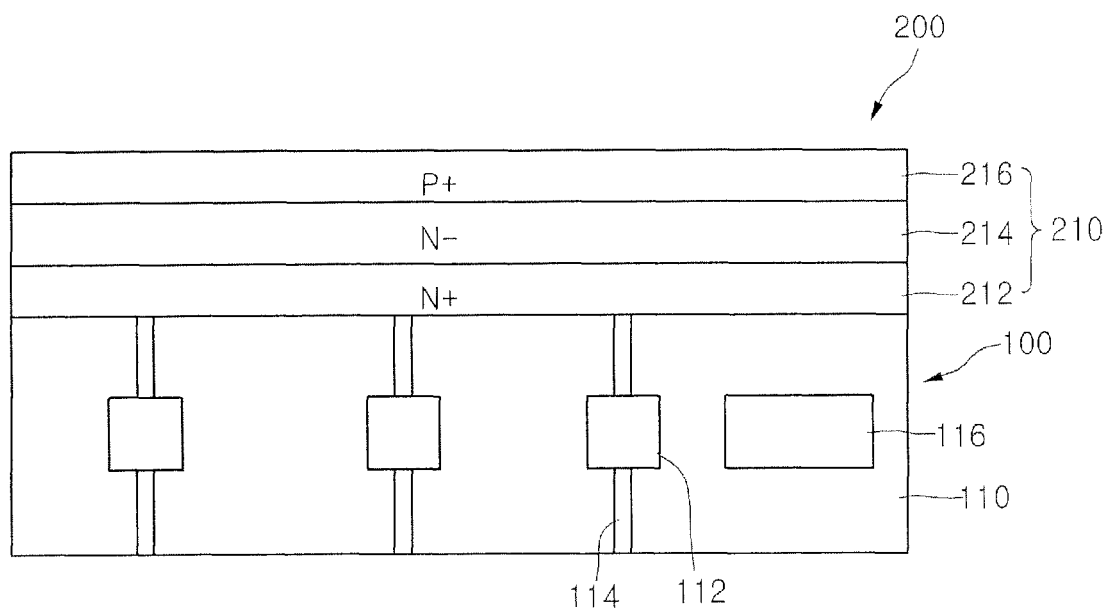
FIG. 2 is a cross-sectional view of an image sensor of vertical type after a first substrate is bonded to the second substrate in accordance with an embodiment.

FIG. 2 is a cross-sectional view of an image sensor of vertical type after the first substrate is bonded to the second substrate in accordance with an embodiment.

For example, the second substrate 200 is reversed to be bonded to the first substrate 100 so that the first high-concentration first conductivity type conductive layer 212 contacts the insulation layer 110.

The surface energy of the surface to be bonded is raised by the activation of plasma before the first substrate 100 is bonded to the second substrate 200, thereby making it possible to perform the bonding. Meanwhile, in order to improve bonding strength, the bonding can be performed by interposing an insulation layer, a metal layer, etc. on the bonded interface.

Thereafter, the hydrogen ion implanting layer 207a is changed into a hydrogen gas layer (not shown) on the second substrate 200 through an annealing process, and based on the hydrogen gas layer, the image sensing unit 210 is maintained and other portions (bottom portions) of the second substrate 200 are removed using, for example, a blade.

Therefore, the image sensor of vertical type as shown in FIG. 2 is completed.

Figure 3:
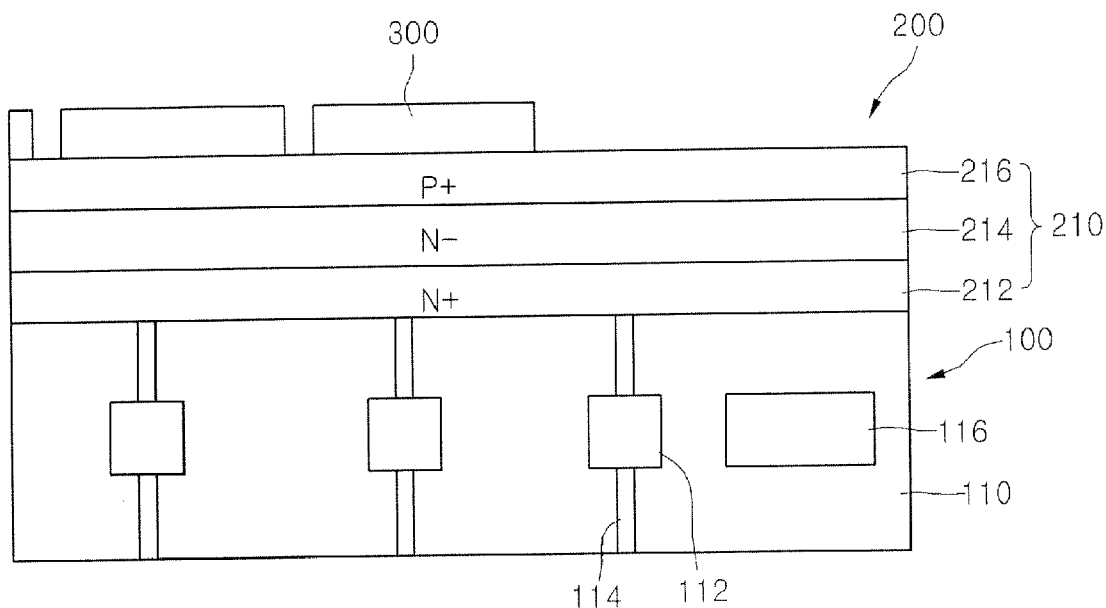
FIG. 3 is a cross-sectional view of the image sensor of vertical type after a mask for forming a pixel trench isolation (PTI) is formed on the image sensing unit in accordance with an embodiment.

FIG. 3 is a cross-sectional view of the image sensor of vertical type after a mask. 300 for forming a pixel trench isolation (PTI) is formed on the image sensing unit 210 according to an embodiment.

For example, the mask 300 that defines a trench region for dividing the image sensing unit 210 for each pixel is formed on the image sensing unit 210.

Figure 4:
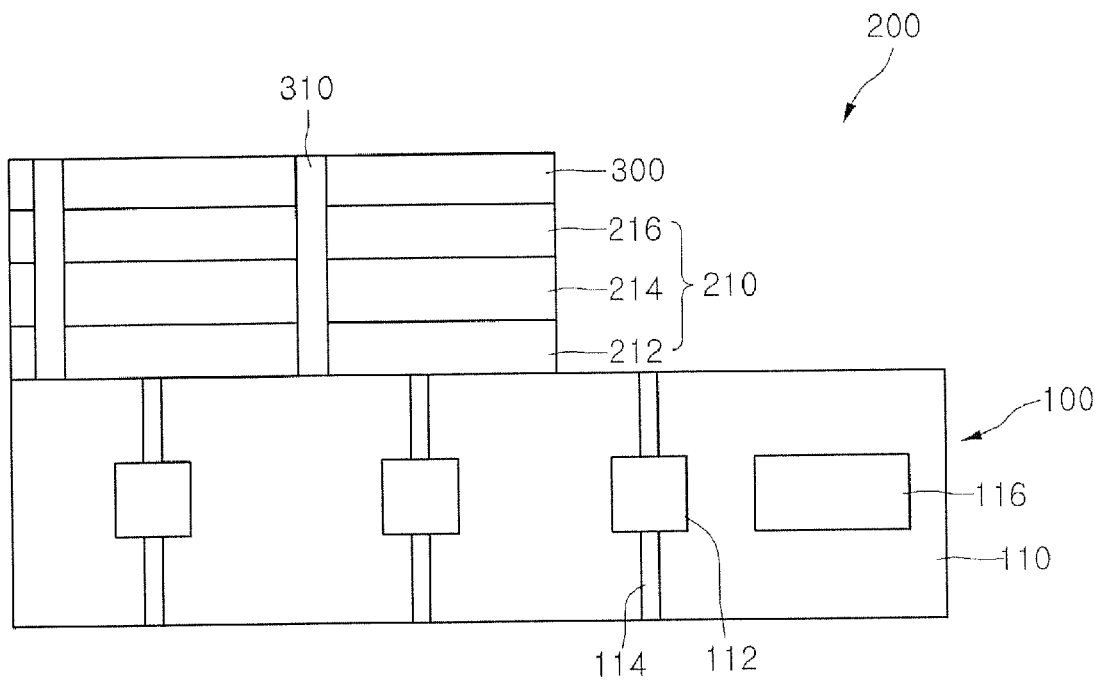
FIG. 4 is a cross-sectional view of the image sensor of vertical type after a PTI is formed on the image sensing unit in accordance with an embodiment.

Thereafter, referring to FIG. 4, the image sensing unit 210 is etched using the mask 300 so that a trench is formed in the image sensing unit 210. The trench is filled with an insulation layer, thereby forming a pixel trench isolation (PTI) 310.

At this time, excessive plasma damage by the trench etching process is generated so that crystal defects are generated on the semiconductor substrate. According to embodiments of the invention, the following back end process is performed for curing such crystal defects.

Figure 5:
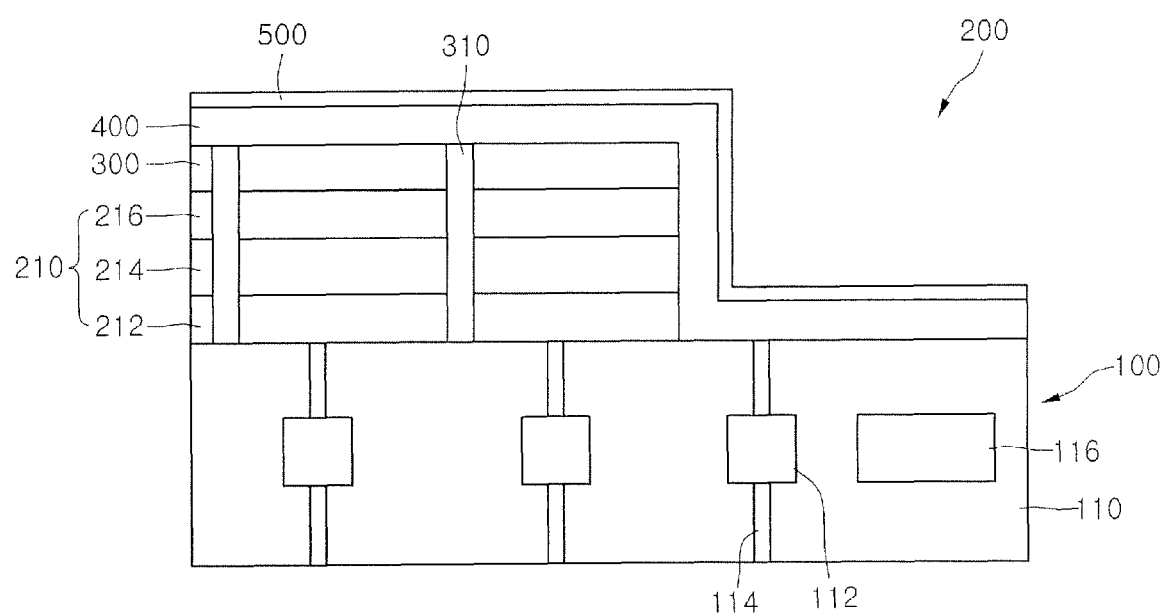
FIG. 5 is a cross-sectional view of the image sensor of vertical type after a nitride-based second material layer is formed in accordance with an embodiment.

Referring to FIG. 5, a silicate-based first material layer 400 is formed on the mask 300, the PTI 310, and the insulation layer 110.

For example, the first material layer 400 may be formed by including tetraethyl orthosilicate:Si ($C_2H_5O_4$) and can be formed at a thickness of about 3500 Å to 4500 Å.

If the first material layer 400 is formed, a nitride-based second material layer 500 is formed over the first material layer 400.

For example, the second material layer 500 may be formed by including SiN and be formed at a thickness of about 900 Å to 1100 Å.

Next, an annealing is performed in order to cure the crystal defects. In an embodiment, a deuterium annealing process is used.

Deuterium, a hydrogen isotope, has a chemical property similar to ordinary hydrogen, but has twice the mass. In other words, the atomic nucleus of hydrogen is formed of one proton, whereas the atomic nucleus of deuterium is formed of one proton and one neutron.

Therefore, deuterium is heavier than hydrogen by twice or more and has better bonding strength with the semiconductor substrate, making it possible to effectively cure the crystal defects of the semiconductor substrate and to improve the deterioration of low illumination characteristics by improving free electron characteristics caused by the plasma damage.

In the embodiment, the deuterium annealing process may be performed at a temperature of about 400° C. to 450° C. for 20 to 40 minutes at chamber pressure of about 20 atm to 30 atm.

Thereafter, the mask 300, the first material layer 400, and the second material layer 500 are removed, and then processes of forming an upper electrode (not shown), a color filter (not shown), etc. are performed.

According to embodiments, the following acting effects can be obtained:

First, the crystal defects of the substrate generated when performing the trench etching on the donor substrate to define pixel boundaries are cured by performing a deuterium annealing process, making it possible to improve the sensitivity and illumination characteristics of the image sensor of vertical type.

Second, the defects such as dark defects generated when performing the trench etching on the donor substrate to define pixel boundaries can be effectively cured, making it possible to improve the sensitivity and illumination characteristics of the image sensor of vertical type and to improve the production yield.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing method of an image sensor of vertical type, comprising:
   forming a crystalline semiconductor layer on a second substrate;
   forming a hydrogen ion implanting layer on the interface between the second substrate and the crystalline semiconductor layer;
   implanting ions onto the crystalline semiconductor layer to form an image sensing unit;
   bonding the second substrate having the image sensing unit to a first substrate over an insulation layer on the first substrate;
   forming a trench in the second substrate in order to divide the image sensing unit for each pixel;
   forming a pixel trench isolation (PTI) by gap-filling the trench with insulating material;
   forming a first material layer over the PTI, the image sensing unit, and the insulation layer; and
   forming a second material layer over the first material layer and performing a deuterium annealing process thereon.

2. The manufacturing method of the image sensor of vertical type according to claim 1, wherein the implanting ions onto the crystalline semiconductor layer to form the image sensing unit comprises:
   forming a second conductivity type conductive layer at a lower portion of the crystalline semiconductor layer;
   forming a first conductivity type conductive layer over the second conductivity type conductive layer; and
   forming a high-concentration first conductivity type conductive layer over the first conductivity type conductive layer.

3. The manufacturing method of the image sensor of vertical type according to claim 1, wherein the bonding of the second substrate to the first substrate further comprises:
   changing the hydrogen ion implanting layer into hydrogen gas layer after the image sensing unit is bonded to the insulation layer; and
   removing the second substrate except the image sensing unit based on the hydrogen gas layer.

4. The manufacturing method of the image sensor of vertical type according to claim 1, wherein the forming of the trench in the second substrate comprises:
   forming a mask that defines the trench region over the image sensing unit; and
   forming the trench in the image sensing unit by performing an etching process using the mask as an etching mask.

5. The manufacturing method of the image sensor of vertical type according to claim 1, wherein the first material layer includes silicate-based material, and the second material layer includes nitride-based material.

6. The manufacturing method of the image sensor of vertical type according to claim 5, wherein the first material layer includes TEOS, and the second material layer includes SiN.

7. The manufacturing method of the image sensor of vertical type according to claim 1, wherein the first material layer is formed at a thickness of 3500 Å to 4500 Å.

8. The manufacturing method of the image sensor of vertical type according to claim 1, wherein the second material layer is formed at a thickness of 900 Å to 1100 Å.

9. The manufacturing method of the image sensor of vertical type according to claim 1, wherein the deuterium annealing process is performed by satisfying one or more process conditions of a temperature of about 400° C. to 450° C., time of 20 to 40 minutes, and chamber pressure of about 20 atm to 30 atm.

* * * * *